US006741732B2

(12) United States Patent
Yui

(10) Patent No.: US 6,741,732 B2
(45) Date of Patent: *May 25, 2004

(54) EXPOSURE METHOD AND DEVICE MANUFACTURING METHOD USING THIS EXPOSURE METHOD

(75) Inventor: Yoshikiyo Yui, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/166,595

(22) Filed: Oct. 6, 1998

(65) Prior Publication Data

US 2004/0071336 A1 Apr. 15, 2004

(30) Foreign Application Priority Data

Oct. 9, 1997 (JP) ............................................. 9-291811
Aug. 28, 1998 (JP) ........................................... 10-257652

(51) Int. Cl.$^7$ ................................................. G06K 9/03
(52) U.S. Cl. ........................ 382/144; 382/145; 382/148; 382/151; 438/7; 438/16
(58) Field of Search ............................... 382/144, 145, 382/148, 149, 151, 215, 275, 294, 309; 250/559.05, 559.1, 559.2, 559.39, 559.44; 348/87, 95, 126, 129, 187; 356/124, 390, 373, 397, 396, 239.2, 237.5; 359/724; 430/15, 22; 438/7, 16; 716/21; 702/40, 85; 355/52; 353/69

(56) References Cited

U.S. PATENT DOCUMENTS 4,621,371 A * 11/1986 Gotou et al. .................. 378/34
4,812,661 A * 3/1989 Owen ......................... 250/491.1
5,276,519 A * 1/1994 Richards et al. ............. 358/209
5,308,991 A * 5/1994 Kaplan .................... 250/492.22
5,773,836 A * 6/1998 Hartley ..................... 250/491.1
5,848,197 A * 12/1998 Ebihara ....................... 382/275
5,978,081 A * 11/1999 Michael et al. ........... 356/243.1

FOREIGN PATENT DOCUMENTS

| JP | 62-58621 | 3/1987 | ........... H01L/21/30 |
| JP | 62-149127 | 7/1987 | ........... H01L/21/30 |
| JP | 2625124 | 4/1997 | ........... H01L/21/30 |

* cited by examiner

Primary Examiner—Brian Werner
(74) Attorney, Agent, or Firm—Fitzpatrick, Cella, Harper & Scinto

(57) ABSTRACT

In an exposure method of drawing and exposing a second pattern with a scanner so as to match a first pattern formed on a sample upon exposure with a reduction projection exposure apparatus, a matrix is set on the sample. A distortion correction map representing an offset of a point corresponding to each matrix point on the first pattern from an ideal position is formed. The blocks of the matrix, small for a large offset and large for a small offset, are set when drawing the second pattern while correcting drawing information of the second pattern on the basis of offset information represented by the correction map. The block size of the distortion correction map is not uniformly reduced. A small block size is set for a large distortion, and a large block size is set for a small distortion, thereby reducing the data amount. A necessary and sufficient block size is set for distortion correction to minimize the number of times of arithmetic operation for correction processing without increasing the memory size, thereby achieving high-speed processing.

20 Claims, 8 Drawing Sheets

EXPOSURE METHOD AND DEVICE MANUFACTURING METHOD USING THIS EXPOSURE METHOD

BACKGROUND OF THE INVENTION

1. Field of the Invention

The present invention relates to an exposure method of forming a fine pattern such as a semiconductor device using both an optical reduction projection exposure apparatus represented by a stepper and a scanner represented by an electron beam drawing apparatus, and a device manufacturing method using this exposure method.

2. Description of the Related Art

Strong demand has recently arisen for a higher packing density and a higher integration degree of semiconductor integrated circuits. In particular, the purpose of obtaining a high integration degree having a line width of 0.15 µm or less cannot be achieved by use of a conventional exposure apparatus using light (including an X-ray). Patterns must be drawn using electron beams or ion beams. This exposure using a scanner suffers a low throughput as compared with an optical exposure apparatus. A mix-and-match method (or hybrid exposure) for exposing a layer allowing a relatively low resolution with an optical exposure apparatus and a layer requiring a high resolution or high accuracy with a scanner has been proposed (e.g., Japanese Patent No. 2625124 and Japanese Patent Laid-Open Nos. 62-58621 and 62-149127).

In this mix-and-match method, an exposed pattern distorts due to the behaviors (mainly aberrations) of the projection optical system for forming a reticle pattern on a wafer serving as a sample in the optical reduction projection exposure apparatus. Exposure using the scanner allows relatively free control for a beam irradiated position.

In the mix-and-match method in, e.g., Japanese Patent Laid-Open No. 62-58621, a large number of exposure distortion measurement marks are formed in a matrix at almost the central portion of a wafer in a square area corresponding to the maximum exposure area of the optical reduction projection exposure apparatus. The positions of these marks are actually measured, and an exposure distortion amount per correction field (correction block) having an area of 250 µm□ (i.e., an area having one side of 250 µm) within the above area is obtained. A map representing the distribution of exposure distortion amounts (to be referred to as a map hereinafter) is stored in the memory of a charged beam drawing apparatus. The charged beam drawing apparatus corrects drawing data in accordance with the exposure distortion and draws a pattern. As described above, the drawing pattern is distorted in accordance with the distortion of the pattern formed by exposure using the optical reduction projection exposure apparatus, which distortion is caused by the aberrations of the projection optical system of the exposure apparatus. A highly accurately matched pattern is drawn on the exposure pattern. In this case, the blocks of the matrix are arranged at an equal pitch, as shown in FIG. 8A. FIG. 8A shows an ideal matrix. FIG. 8B shows a matrix distorting due to the aberrations of the projection optical system, assuming that the ideal matrix in FIG. 8A is printed on the wafer by the optical reduction projection exposure apparatus.

To increase the overlay accuracy, the block pitch must be decreased to increase the map accuracy in the blocks having an equal pitch as shown in the conventional case. The term overlay accuracy is generally understood in the art to refer to a measure of accuracy between two patterns. For example, as the block pitch decreases to ½, the number of intersections between the vertical and horizontal lines of the matrix (the intersections are referred to as matrix points hereinafter), i.e., the number of distortion data points, increased by a factor of four. That is, the number of matrix points increases in proportion to the square of the number of vertical or horizontal lines of the matrix. Therefore, the data amount greatly increases accordingly.

SUMMARY OF THE INVENTION

The present invention has been made in consideration of the conventional problems described above, and has as its object to increase the overlay accuracy while suppressing an increase in the memory size of a distortion correction map in a mix-and-match method.

In order to achieve the above object, an exposure method and a device manufacturing method using this exposure method according to the present invention are constituted as follows.

That is, an exposure method of drawing and exposing a second pattern with a scanner so as to match a first pattern formed on a sample upon exposure with a reduction projection exposure apparatus, comprises the steps of:

setting a matrix on the sample;

forming a distortion correction map representing an offset of a point corresponding to each matrix point on the first pattern from an ideal position; and setting a block of the matrix small for a large offset and large for a small offset when drawing the second pattern while correcting drawing information of the second pattern on the basis of offset information represented by the correction map.

A device manufacturing method including an exposure step comprises the step of manufacturing a device by performing exposure using the exposure method.

According to a preferred embodiment of the present invention, the exposure method comprises the step of setting a size of the block on the basis of an overlay accuracy required in drawing the second pattern on the first pattern.

According to another preferred embodiment of the present invention, the exposure method comprises the step of drawing the second pattern prior to the first pattern.

According to still another preferred embodiment of the present invention, the exposure method comprises the step of drawing the first pattern prior to the second pattern.

According to still another preferred embodiment of the present invention, in the exposure method, the block size of a portion having the large offset is 50 µm□ to 1,000 µm□.

According to still another preferred embodiment of the present invention, in the exposure method, the block size of a portion having the large offset is 50 µm□ to 1,000 µm□.

According to still another preferred embodiment of the present invention, in the exposure method, the scanner is an electron beam drawing apparatus.

According to still another preferred embodiment of the present invention, the exposure method comprises the step of changing the block size to an optimal block size for performing distortion correction on the basis of a measured distortion amount.

According to still another preferred embodiment of the present invention, the exposure method comprises the step of performing coarse setting for the block size by thinning distortion data of the matrix points in accordance with a distortion difference between adjacent matrix points.

According to still another preferred embodiment of the present invention, the exposure method comprises the step of performing fine setting for the block size by adding distortion data of the matrix points in accordance with a distortion difference between adjacent matrix points.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention, and together with the description, serve to explain the principles of the invention.

DETAILED DESCRIPTION OF THE PREFERRED EMBODIMENTS

Preferred embodiments of the present invention will be described in detail in accordance with the accompanying drawings.

First Embodiment

Figure 1:
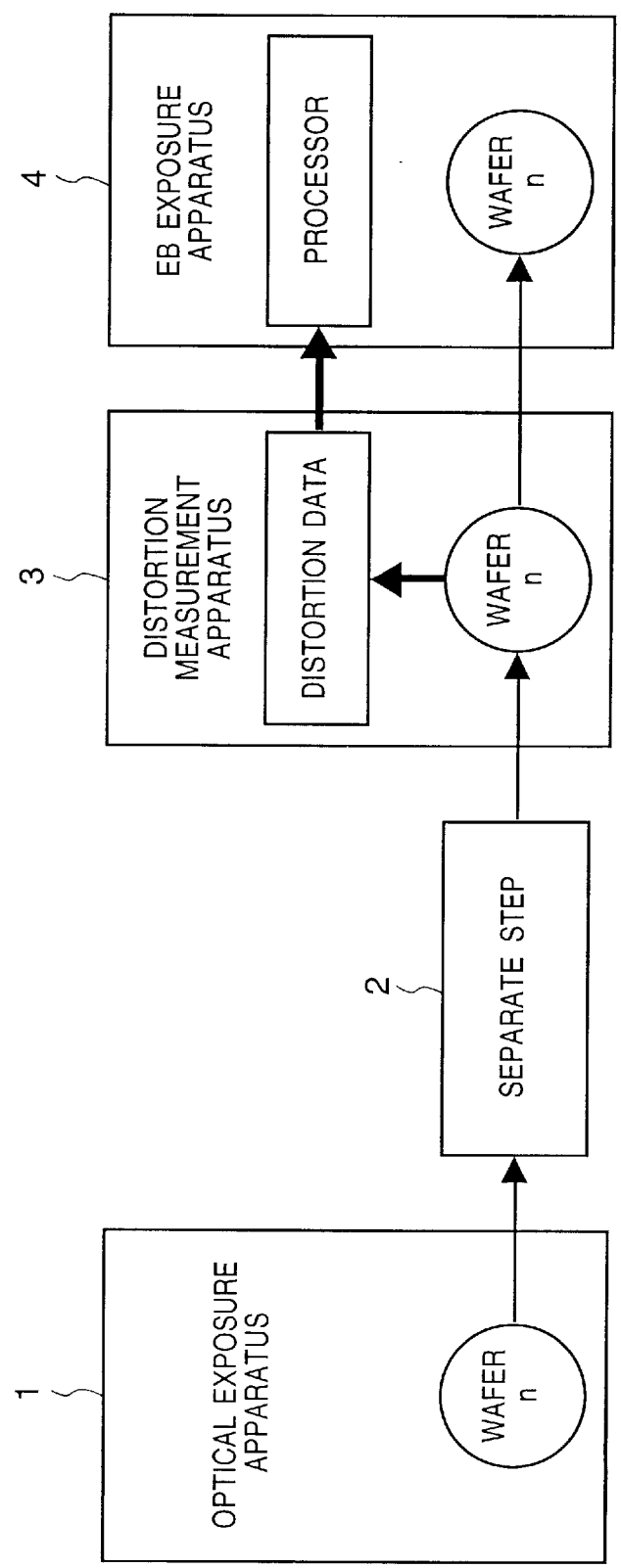
FIG. 1 is a block diagram showing the arrangement of a mix-and-match system according to an embodiment of the present invention.

FIG. 1 shows the arrangement of a mix-and-match system according to the first embodiment of the present invention. Referring to FIG. 1, reference numeral 1 denotes an optical exposure apparatus such as a reduction projection exposure apparatus (stepper); 2, a separate process for performing processes such as development and deposition for a wafer n serving as a sample exposed with the optical exposure apparatus 1; 3, a distortion measurement apparatus for comparing a pattern formed in the separate process 2 with an ideal pattern (design pattern) by observation to measure a pattern distortion per chip (exposure area of the optical exposure apparatus 1) on the wafer n; and 4, an electron beam (EB) exposure apparatus for drawing a pattern on the wafer n upon matching a predetermined drawing pattern with the pattern formed by the optical exposure apparatus 1 and in the separate process 2.

Figure 2:
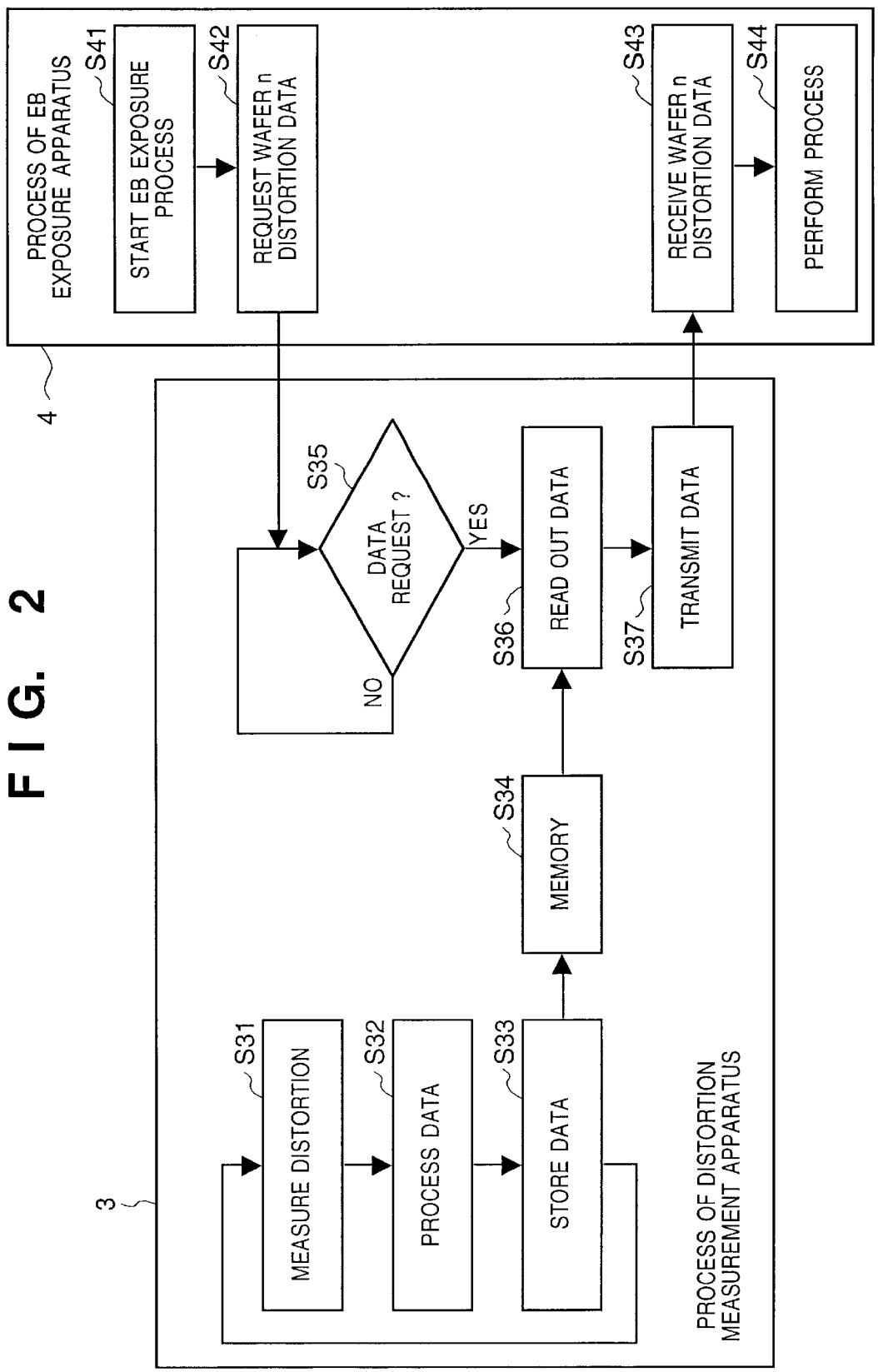
FIG. 2 is a flow chart for explaining the operation of the mix-and-match system shown in FIG. 1.
Figure 3A:
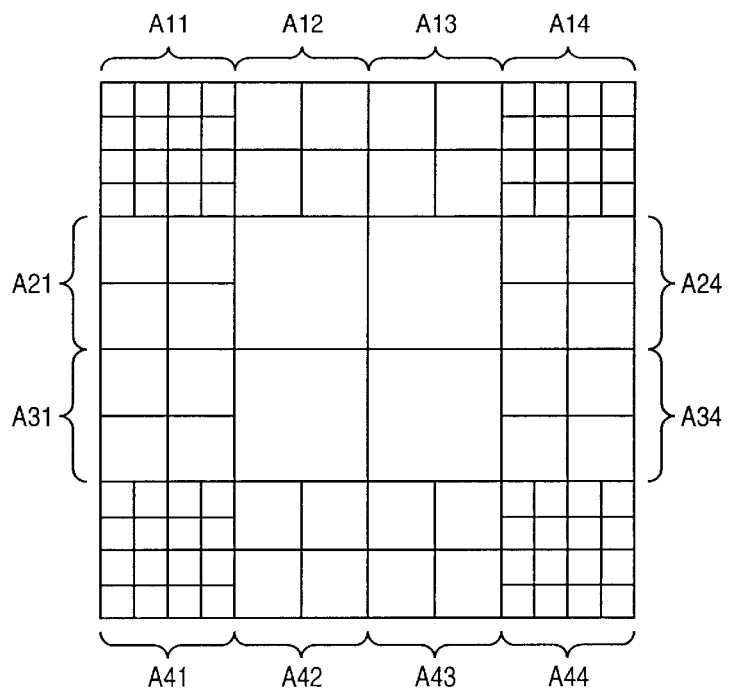
FIG. 3A is a view showing the ideal matrix for distortion correction map measurement according to the embodiment of the present invention.
Figure 3B:
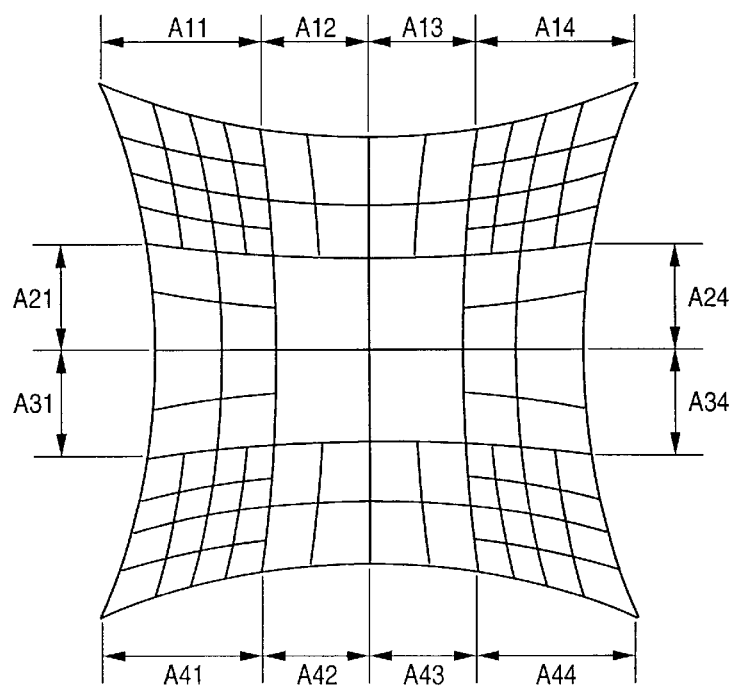
FIG. 3B is a view showing a matrix when the ideal matrix shown in FIG. 3A distorts and is transferred onto a wafer.

FIG. 2 is a flow chart for explaining the operation of the system shown in FIG. 1. Before the wafer n on which the pattern is formed by the optical exposure apparatus 1 and in the separate process 2 is supplied to the EB exposure apparatus 4, the distortion measurement apparatus 3 measures the distortions of patterns formed on the wafer n (step S31), processes the measurement data (step S32), and stores the processed data in a memory 34 (step S33). In general, distortions are large near the four corners of a chip, and small at the central portion of the chip. In this embodiment, as shown in FIG. 3A, a total of 16 correction areas, i.e., areas A11 to A44 are set by dividing each chip into four areas in both the vertical and horizontal directions. Distortions as offset amounts from the ideal matrix are measured for the areas A11, A14, A44, and A41 at the four corners of the chip at a pitch of 50 $\mu$m (block size: 50 $\mu$m☐) in both the vertical and horizontal directions. The distortions of the eight areas A12, A13, A24, A34, A43, A42, A31, and A21 at the respective sides of the chip are measured at a pitch of 250 $\mu$m (block size: 250 $\mu$m☐). The distortions of the four areas A22, A23, A33, and A32 at the central portion of the chip are measured at a pitch of 1,000 $\mu$m (block size: 1,000 $\mu$m☐). FIG. 3A shows the ideal matrix according to this embodiment, and FIG. 3B shows a matrix distorted and transferred onto the wafer.

A distortion at a desired point cannot necessarily be measured. In this case, distortions are measured at measurable points, and the distortion of the desired point is calculated by approximating a distortion state by a higher-order polynomial using the measurement results. In data processing of step S32, these distortions can be calculated, and measurement point information and block size information can be added.

When the wafer n is loaded into the EB exposure apparatus 4, an EB exposure process is started (step S41). A distortion data request for the wafer n is transmitted to the distortion measurement apparatus 3 (step S42). When the distortion measurement apparatus 3 receives the distortion data request (step S35), the distortion data of the wafer n is read out from the memory 34 (step S36) and transmitted to the EB exposure apparatus 4 (step S37). When the EB exposure apparatus 4 receives the distortion data of the wafer n from the distortion measurement apparatus 3 (step S43), the EB exposure apparatus 4 corrects the drawing pattern data on the basis of the received distortion data and performs drawing (step S44).

In the above description, the block sizes are fixed to large, medium, and small areas. The block size may be set as follows. The distortion may be measured and calculated using the block size having the small pitch, and data may be thinned in accordance with the distortion difference between the adjacent matrix points. Alternatively, the distortion may be measured and calculated using the block size having the large pitch, and points for data measurement and calculation may be added in accordance with the distortion difference of the adjacent matrix points. That is, the block size is changed on the basis of the distortion amount of the measured matrix points, so that an optimal block size for distortion correction can be determined.

Each block size may be adjusted on the basis of an overlay accuracy required for a given pattern. If a high overlay accuracy is required, the block pitch is so reduced as to allow the distortion difference between the adjacent matrix points to satisfy the required overlay accuracy. To the contrary, when the required overlay accuracy is not so strict, the block pitch may be increased to increase the distortion difference between the adjacent matrix points to the upper limit of the required overlay accuracy.

A combination of the above block size setting methods may be used. For example, the large block size may be set to a fixed value guaranteed by the system, while the small block size is set in accordance with the required overlay accuracy.

In the above description, actual element patterns are observed, and distortions are measured. However, as disclosed in Japanese Patent Laid-Open No. 62-58621 previously cited, an exposure distortion measurement wafer may be prepared, and the distortion of each matrix point may be obtained on the basis of the measurement result of marks formed on the wafer. In this case, a pattern need not be formed by the optical exposure apparatus 1 prior to drawing by the EB exposure apparatus 4. A pattern layer drawn by the EB exposure apparatus 4 may be used as an underlayer to perform pattern exposure using the optical exposure apparatus 1. To obtain the distortions of all chips by using the measurement values of some chips on a wafer, if parameters such as behaviors of stage movement of an optical exposure apparatus to be used are already known, values obtained by correcting the distortions of the measured chips using the parameters in units of chips are preferably stored in the memory 34.

In the conventional case, drawing with the scanner is performed on a pattern exposed and formed by the reduction projection exposure apparatus. However, drawing according to the present invention may be performed prior to formation of the pattern by the reduction projection exposure apparatus. The block size for the portion having the large offset preferably falls within the range of 20 $\mu$m□ to 250 $\mu$m□.

With the above arrangement, a portion having a large offset (distortion) can have a high overlay accuracy because distortion correction accuracy is increased. For a portion having a small distortion, since a change in distortion amount is small, a large increase in correction accuracy is not obtained at a smaller block size. Even if the block size for the portion having a small distortion increases, the correction accuracy rarely changes, but the memory size of the correction map can advantageously decrease. For example, the block size for the portion having a large distortion is set to 50 $\mu$m□, and the block size for the portion having a small distortion is set to 250 $\mu$m□. If a portion having the block size of 50 $\mu$m□ is ¼ the maximum exposure area, the memory size of the distortion correction map becomes 7/25 the case in which the total area is divided into 50-$\mu$m□ blocks. The relatively wide portion of the central portion of the chip has a smaller distortion. If the block size of this portion increases, the memory size can be further reduced in practice. The block size is adjusted on the basis of the overlay accuracy for a given pattern such that the block size is reduced for a higher overlay accuracy, and otherwise increased. The memory size of the distortion correction map can be minimized and optimized.

According to the present invention, the block size of the distortion correction map is not uniformly reduced. A small block size is set for a large distortion, and a large block size is set for a small distortion, thereby reducing the data amount. A necessary and sufficient block size is set for distortion correction to minimize the number of times of arithmetic operation for correction processing without increasing the memory size, thereby achieving high-speed processing.

Second Embodiment

Figure 4:
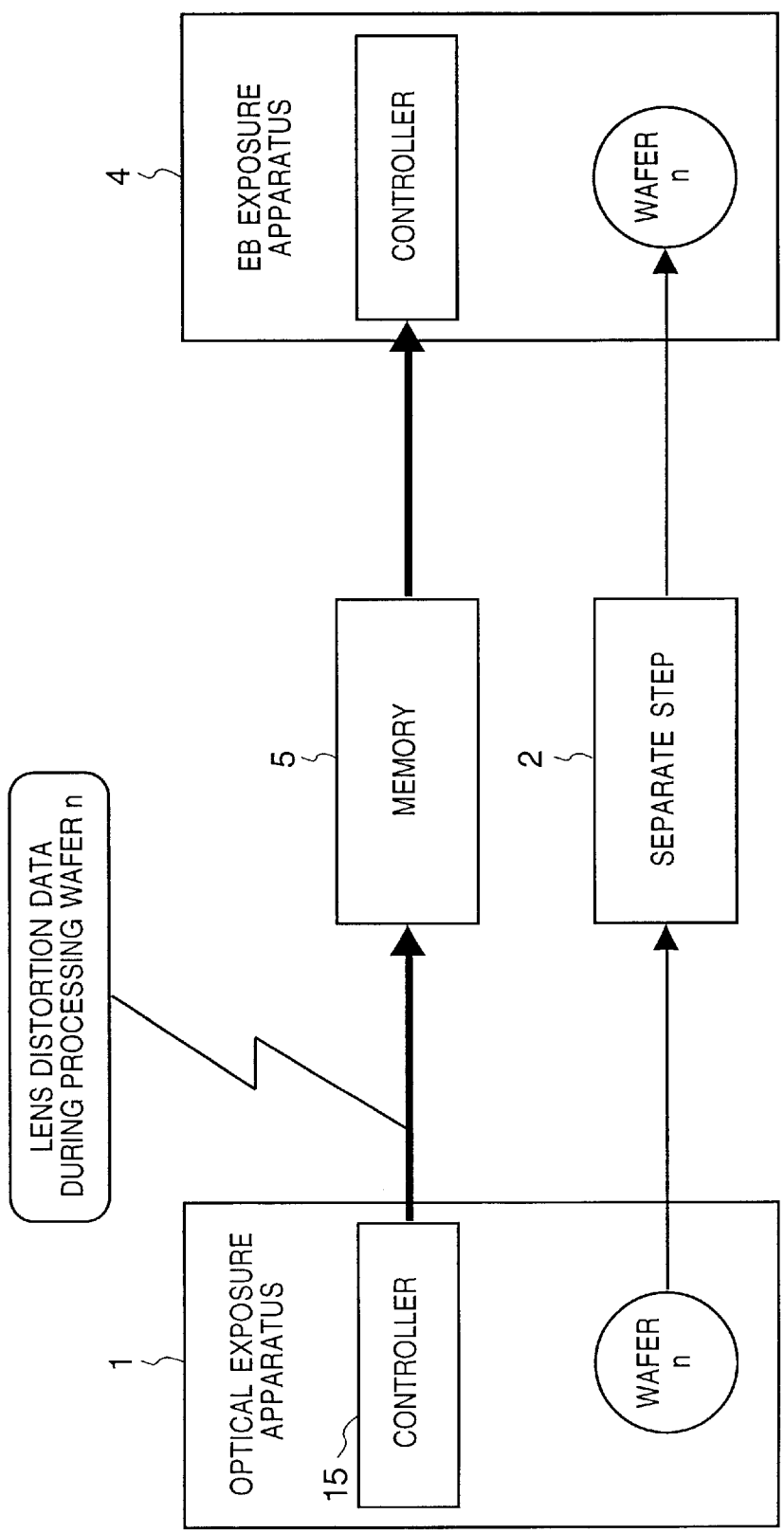
FIG. 4 is a block diagram showing the arrangement of a mix-and-match system according to another embodiment of the present invention.

FIG. 4 shows the arrangement of a mix-and-match system according to the second embodiment of the present invention. Referring to FIG. 4, reference numeral 1 denotes an optical exposure apparatus such as a reduction projection exposure apparatus (stepper); 2, a separate process for performing processes such as development and deposition for a wafer n serving as a sample exposed with the optical exposure apparatus 1; 4, an electron beam (EB) exposure apparatus for drawing a pattern on the wafer n upon matching a predetermined drawing pattern with the pattern formed by the optical exposure apparatus 1 and in the separate process 2; and 5, a memory for storing data transmitted from a controller 15 in the optical exposure apparatus 1.

Referring to FIG. 4, lens distortion parameters of the optical exposure apparatus 1 are measured in advance and input to the controller 15. Lens distortion data upon processing the wafer n are calculated on the basis of pattern data used in processing the wafer n and wafer process parameters, and the lens distortion parameters input to the controller 15. The lens distortion data are stored as a distortion correction map (FIGS. 3A and 3B) in the memory 5.

Figure 5:
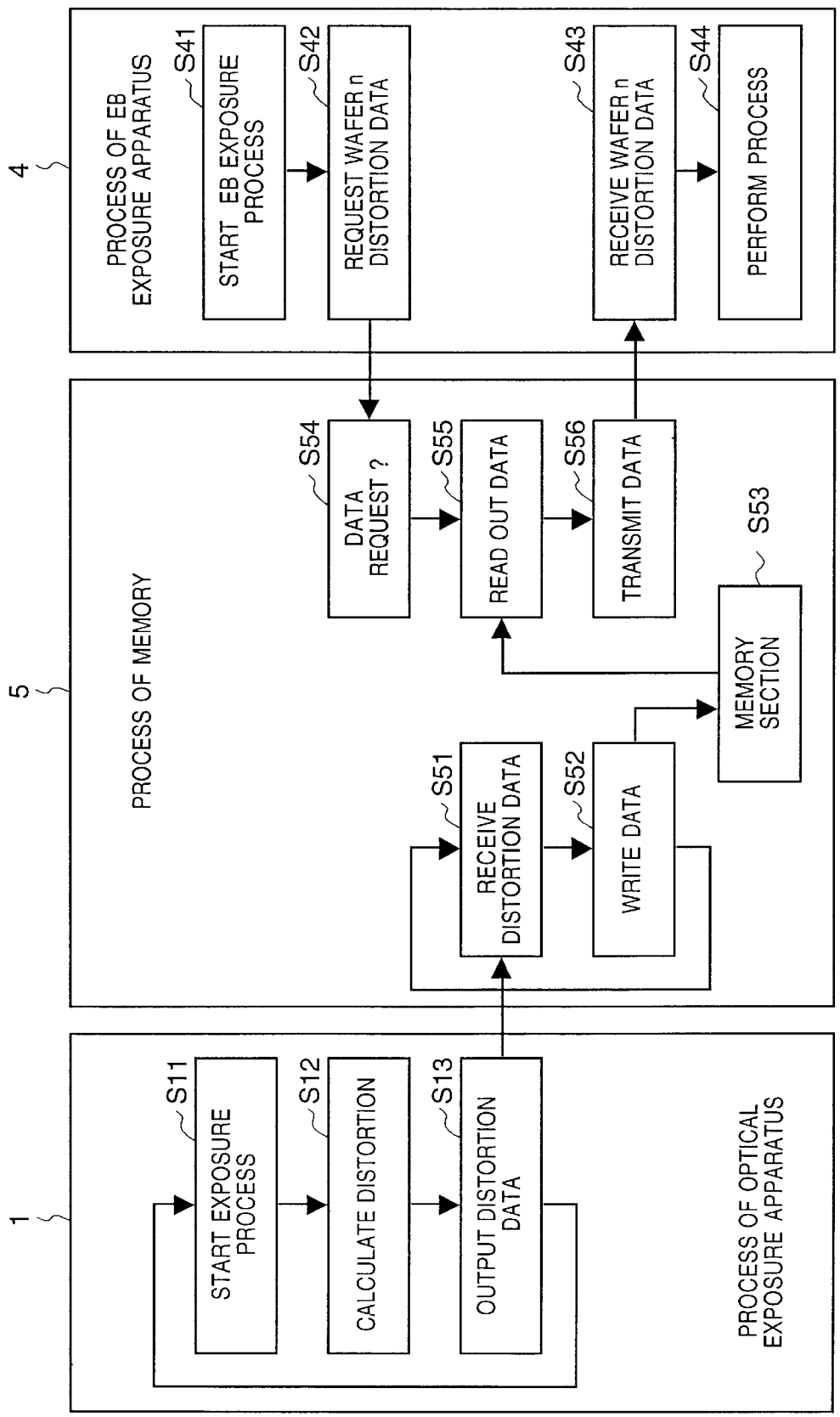
FIG. 5 is a flow chart for explaining the operation of the mix-and-match system shown in FIG. 4.

FIG. 5 is a view for explaining the operation of the system in FIG. 4. The optical exposure apparatus 1 calculates distortions which are then stored in a memory section 53 in the memory 5. The EB exposure apparatus 4 requests distortion data to the memory 5 and executes a drawing process in accordance with the input distortion data.

The optical exposure apparatus 1 calculates distortion data on the basis of alignment mark measurement values and focus measurement values, and the lens distortion parameters in processing the wafer n (steps S11 and S12) and outputs the calculated distortion data to the memory 5 (step S13). Upon reception of the data output from the optical exposure apparatus 1 (step S51), the memory 5 writes the data in the memory section 53 (step S52).

When the wafer n on which the pattern is formed by the optical exposure apparatus 1 and in the separate process 2 is loaded in the EB exposure apparatus 4, the EB exposure apparatus 4 starts an EB exposure process (step S41). The EB exposure apparatus 4 sends a wafer n distortion data request to the memory 5 (step S42). Upon reception of the distortion data request (step S54), the memory 5 reads out the wafer n distortion data from the memory section 53 (step S55) and transmits it to the EB exposure apparatus 4 (step S56). Upon reception of the wafer n distortion data from the memory 5 (step S43), the EB exposure apparatus 4 corrects the drawing pattern data on the basis of the received distortion data and performs drawing (step S44).

The optical exposure apparatus 1 can directly calculate the distortion amount on the basis of the parameters associated with the lens distortions measured in advance, the pattern data obtained during processing the wafer n, and the wafer processing parameters.

As in the first embodiment, the block size for distortion correction is changed depending on the distortion amount (FIGS. 3A and 3B) and is not uniformly reduced. A small block size is set for a large distortion, and a large block size is set for a small distortion, thereby reducing the data amount. A necessary and sufficient block size is set for distortion correction to minimize the number of times of arithmetic operation for correction processing without increasing the memory size, thereby achieving high-speed processing.

Embodiment Applied to Device Manufacturing Method

Figure 6:
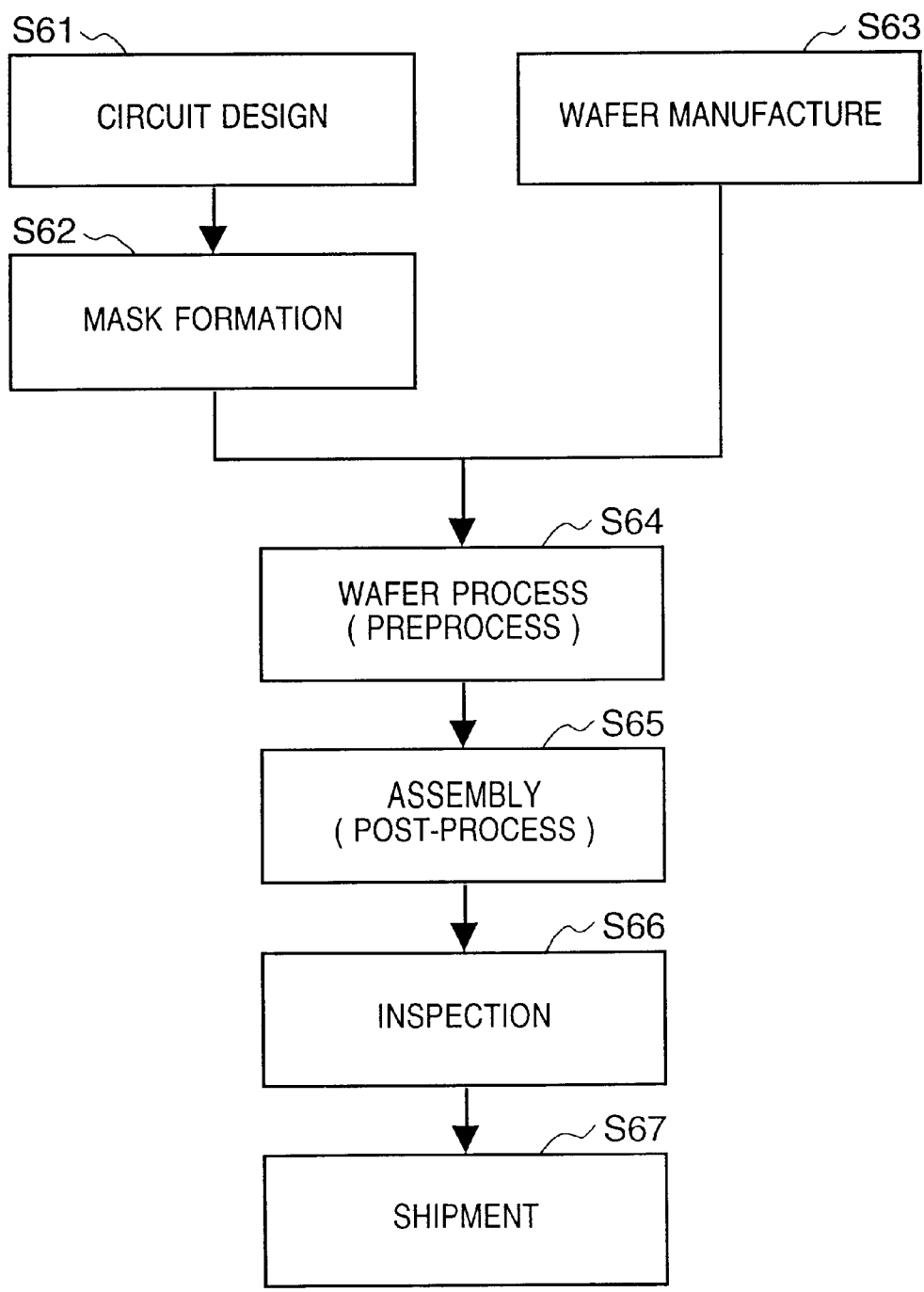
FIG. 6 is a flow chart for explaining a device manufacturing flow.

An application example of a device manufacturing method using the above exposure apparatus or method will now be described. FIG. 6 shows a flow of manufacturing a microdevice (e.g., a semiconductor chip such as an IC or LSI, a liquid crystal panel, a CCD, a thin film magnetic head, or a micromachine). In step S61 (circuit design), a device pattern is designed. In step S62 (mask formation), a mask having the designed pattern is prepared. On the other hand, in step S63 (wafer manufacture), a wafer is manufactured using a material such as silicon or glass. Step S64 (wafer process) is called a preprocess in which an actual circuit is formed on the wafer by a lithography technique using the prepared mask and wafer. The next step S65 (assembly) is called a post-process in which the wafer manufactured in step S64 is cut into semiconductor chips. This step includes an assembly step (dicing and bonding), a packaging step (chip encapsulation), and the like. In step S66 (inspection), the operation and durability of the semiconductor device manufactured in step S65 are tested. The semiconductor device is finished through the above steps and is shipped (step S67).

Figure 7:
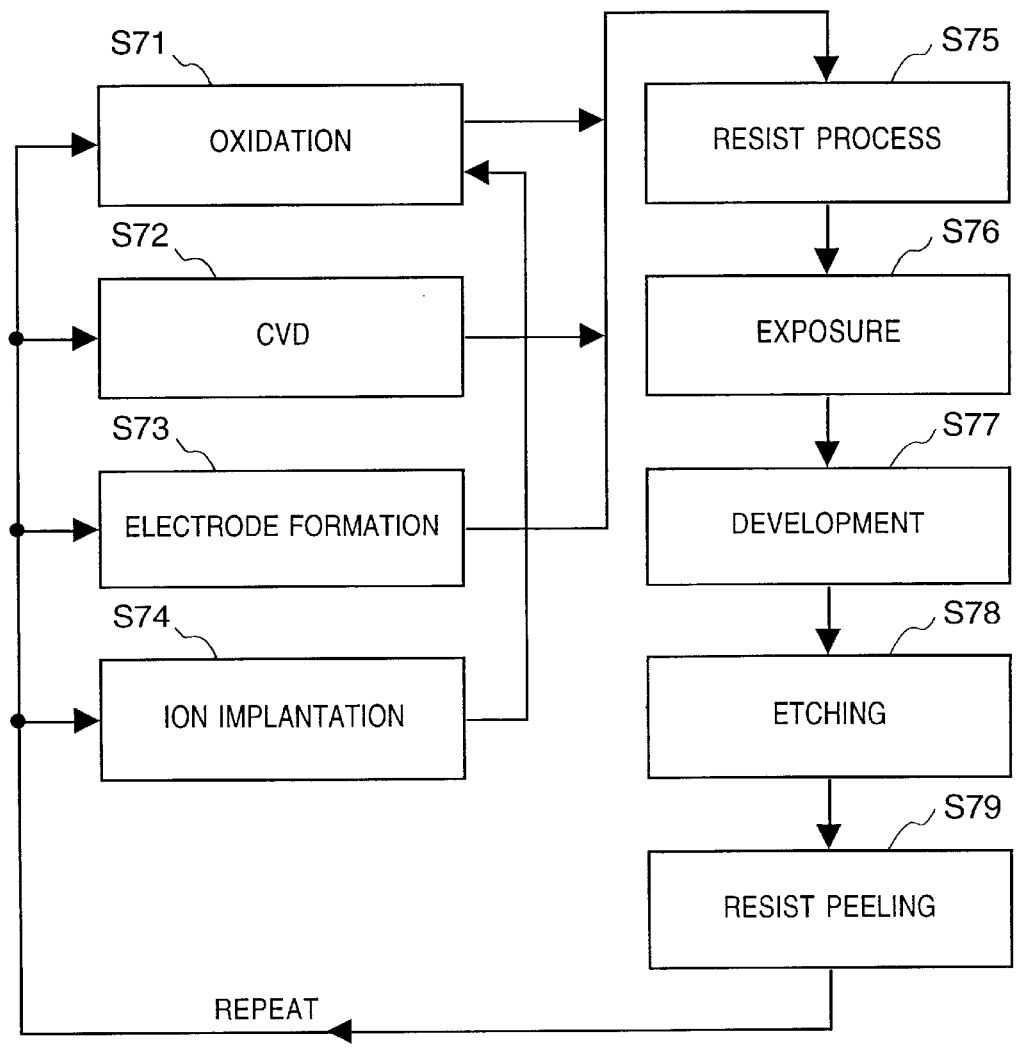
FIG. 7 is a detailed flow chart of the device manufacturing (wafer) process.
Figure 8A:
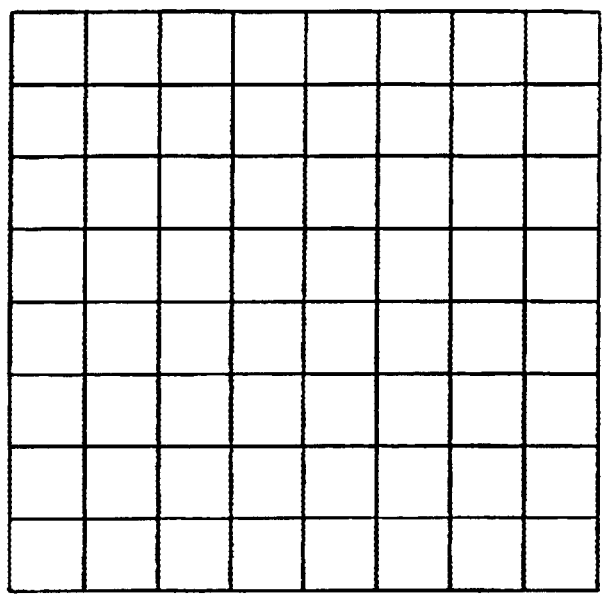
FIG. 8A is a view showing an ideal matrix used in conventional distortion correction.
Figure 8B:
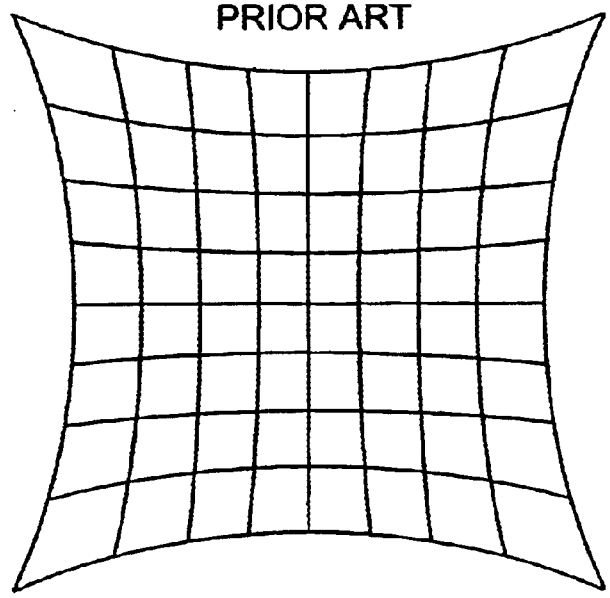
FIG. 8B is a view showing a matrix in a state distorted by aberrations of a projection optical system used in conventional distortion correction.

FIG. 7 shows the detailed flow of the above wafer process. In step S71 (oxidation), the wafer surface is oxidized. In step S72 (CVD), an insulating film is formed on the wafer surface. In step S73, an electrode is formed on the wafer by deposition. In step S74 (ion implantation), ions are implanted in the wafer. In step S75 (resist process), the wafer is coated with a resist. In step S76 (exposure), the mask circuit pattern is repeatedly and parallelly printed and exposed in a plurality of shot areas of the wafer by the mix-and-match exposure method described above. In step S77 (development), the exposed wafer is developed. In step S78 (etching), a portion except the developed resist image is removed. In step S79 (resist peeling), the unnecessary resist upon etching is removed. These steps are repeatedly performed to form a multiple of circuit patterns on the wafer.

When the exposure method of the first or second embodiment is applied to step S76 in FIG. 7, the block size of the distortion correction map is not uniformly reduced. A small block size is set for a large distortion, and a large block size is set for a small distortion, thereby reducing the data amount. A necessary and sufficient block size is set for distortion correction to minimize the number of times of arithmetic operation for correction processing without increasing the memory size, thereby achieving high-speed processing. The manufacture of high-precision devices, which is difficult in the conventional case, is allowed in a high productivity at low cost.

The present invention is not limited to the above embodiments and various changes and modifications can be made within the spirit and scope of the present invention. Therefore, to appraise the public of the scope of the present invention, the following claims are made.

What is claimed is:

1. An exposure method of exposing a second pattern with a second exposure apparatus so as to match a first pattern formed on a sample upon exposure with a first exposure apparatus, said method comprising the steps of:
   setting a matrix on the sample;
   measuring or calculating an offset of a point corresponding to each matrix point on the first pattern from an ideal position;
   forming a distortion correction map representing the measured or calculated offset, wherein a block pitch of a first portion is larger than a block pitch of a second portion on the matrix, an offset in the first portion is smaller than an offset of the second portion, the block pitches are selected based on a required overlay accuracy between the first pattern and the second pattern; and
   exposing the second pattern on the basis of the distortion correction map,
   wherein the overlay accuracy is an accuracy of relative position between the first pattern and the second pattern.

2. The method according to claim 1, further comprising the step of exposing the first pattern after the second pattern.

3. The method according to claim 2, wherein the block pitch of the second portion is 20 µm to 250 µm.

4. A device manufacturing method comprising:
   an exposure step of exposing a sample by using the exposure method of claim 2; and
   a development step of developing the sample.

5. The method according to claim 1, further comprising the step of exposing the first pattern prior to the second pattern.

6. The method according to claim 1, wherein the block pitch of the second portion is 20 µm to 250 µm.

7. A device manufacturing method comprising:
   an exposure step of exposing a sample by using the exposure method of claim 6; and
   a development step of developing the sample.

8. The method according to claim 1, wherein the second exposure apparatus is an electron beam exposure apparatus.

9. A device manufacturing method comprising:
   an exposure step of exposing a sample using the exposure method of claim 1; and
   a development step of developing the sample.

10. The method according to claim 1, wherein the forming step includes performing coarse setting for the block pitch by thinning the offset data of the matrix points.

11. The method according to claim 1, wherein the forming step includes performing fine setting for the block pitch by adding the offset data of the matrix points.

12. An exposure apparatus comprising:
    a controller for performing exposure by using the method of claim 1.

13. The method according to claim 1, wherein the sample includes a plurality of chip portions, and, in the center of each chip portion, the block pitch is larger than the block pitch of the other portions.

14. The method according to claim 1, wherein the first apparatus is a reduction projection exposure apparatus.

15. The method according to claim 1, further comprising the step of correcting drawing information of the second pattern on the basis of offset information represented by the distortion correction map,
    wherein the second pattern is exposed on the basis of the corrected drawing information.

16. The method according to claim 1, wherein the measuring or calculating step performs processing which measures the offset by observing an actual element pattern.

17. The method according to claim 1, wherein the measuring or calculating step performs processing which measures the offset by observing marks, which are formed on the sample, for exposure distortion measurement.

18. The method according to claim 1, wherein the measuring or calculating step calculates the offset based on data about the lens distortion of the first exposure apparatus measured in advance.

19. An exposure method of exposing a second pattern with a second exposure apparatus so as to match a first pattern formed on a sample upon exposure with a first exposure apparatus, said method comprising the steps of:
    setting a matrix on the sample;

measuring or calculating an offset of a point corresponding to each matrix point on the first pattern from an ideal position, wherein a block pitch of a first portion is larger than a block pitch of a second portion on the matrix, an offset in the first position is smaller than an offset of the second position, the block pitches are selected based on a required overlay accuracy between the first pattern and the second pattern; and exposing the second pattern on the basis of the measured or calculated offset, wherein the overlay accuracy is a relative position accuracy between the first pattern and the second pattern.

20. An exposure apparatus comprising:

a controller for performing exposure by using an exposure method of exposing a second pattern with a second exposure apparatus so as to match a first pattern formed on a sample upon exposure with a first exposure apparatus;

wherein the method comprises the steps of:

setting a matrix on the sample;

measuring or calculating an offset of a point corresponding to each matrix point on the first pattern from an ideal position, wherein a block pitch of a first portion is larger than a block pitch of a second portion on the matrix, an offset of the first portion is smaller than an offset of the second portion, the block pitches are selected based on a required overlay accuracy between the first pattern and the second pattern; and exposing the second pattern on the basis of a measured or calculated offset, wherein said overlay accuracy is a relative position accuracy between the first pattern and the second pattern.

* * * * *